(12) United States Patent
DeSteese et al.

(10) Patent No.: US 7,834,263 B2
(45) Date of Patent: Nov. 16, 2010

(54) THERMOELECTRIC POWER SOURCE UTILIZING AMBIENT ENERGY HARVESTING FOR REMOTE SENSING AND TRANSMITTING

(75) Inventors: John G. DeSteese, Kennewick, WA (US); Larry C. Olsen, Kennewick, WA (US)

(73) Assignee: Battelle Memorial Institute, Richland, WA (US)

( * ) Notice: Subject to any disclaimer, the term of this patent is extended or adjusted under 35 U.S.C. 154(b) by 1255 days.

(21) Appl. No.: 10/727,062

(22) Filed: Dec. 2, 2003

(65) Prior Publication Data
US 2005/0115600 A1 Jun. 2, 2005

(51) Int. Cl.
H01L 35/30 (2006.01)
(52) U.S. Cl. ...................... 136/205; 136/225
(58) Field of Classification Search .............. 136/205, 136/225
See application file for complete search history.

(56) References Cited

U.S. PATENT DOCUMENTS

| | | | |
|---|---|---|---|
| 3,554,815 A | 1/1971 | Osborn | |
| 3,648,470 A | 3/1972 | Schultz | |
| 3,900,603 A | 8/1975 | Rittmayer et al. | |
| 3,931,673 A | 1/1976 | Eggemann | |
| 3,945,855 A | 3/1976 | Skrabek et al. | |
| 4,036,665 A | 7/1977 | Barr et al. | |
| 4,092,140 A | 5/1978 | Cerutti et al. | |
| 4,125,122 A | 11/1978 | Stachurski | |
| 4,249,121 A | 2/1981 | Dahlberg | |
| 4,312,402 A | 1/1982 | Basiulis | |
| 4,328,677 A | 5/1982 | Meckler | |
| 4,447,277 A | 5/1984 | Jayadev et al. | |
| 4,497,973 A | 2/1985 | Heath et al. | |
| 4,520,305 A | 5/1985 | Cauchy | |
| 4,566,961 A | 1/1986 | Diaz et al. | |
| 4,677,416 A | 6/1987 | Nishimoto et al. | |

(Continued)

FOREIGN PATENT DOCUMENTS

CH 677421 5/1991

(Continued)

OTHER PUBLICATIONS

Stölzer, M. et al., "Preparation of Highly Effective p-$Bi_{2.5}Sb_{1.5}Te_3$ and n-$Bi_2Te_{2.7}Se_{0.3}$ Films," 15th International Conference on Thermoelectrics, pp. 445-449 (1996).

(Continued)

Primary Examiner—Jeffrey T Barton
(74) Attorney, Agent, or Firm—Klarquist Sparkman, LLP

(57) ABSTRACT

A method and apparatus for providing electrical energy to an electrical device wherein the electrical energy is originally generated from temperature differences in an environment having a first and a second temperature region. A thermoelectric device having a first side and a second side wherein the first side is in communication with a means for transmitting ambient thermal energy collected or rejected in the first temperature region and the second side is in communication with the second temperature region thereby producing a temperature gradient across the thermoelectric device and in turn generating an electrical current.

13 Claims, 6 Drawing Sheets

TE Module With Discreet Elements  Thin-Film TE Array

U.S. PATENT DOCUMENTS

| | | | |
|---|---|---|---|
| 4,859,250 | A | 8/1989 | Buist |
| 4,940,976 | A * | 7/1990 | Gastouniotis et al. ..... 340/870.02 |
| 5,228,923 | A | 7/1993 | Hed |
| 5,286,304 | A | 2/1994 | Macris et al. |
| 5,505,835 | A | 4/1996 | Sakaue et al. |
| 5,883,563 | A | 3/1999 | Horio et al. |
| 6,046,398 | A | 4/2000 | Foote et al. |
| 6,096,964 | A | 8/2000 | Ghamaty et al. |
| 6,096,965 | A | 8/2000 | Ghamaty et al. |
| 6,162,985 | A | 12/2000 | Parise |
| 6,207,887 | B1 * | 3/2001 | Bass et al. ................. 136/201 |
| 6,215,580 | B1 | 4/2001 | Kouta |
| 6,232,543 | B1 | 5/2001 | Nagata |
| 6,288,321 | B1 | 9/2001 | Fleurial et al. |
| 6,340,787 | B1 * | 1/2002 | Simeray et al. ............. 136/201 |
| 6,372,538 | B1 | 4/2002 | Wendt et al. |
| 6,388,185 | B1 | 5/2002 | Fleurial et al. |
| 6,413,645 | B1 | 7/2002 | Graff et al. |
| 6,458,319 | B1 | 10/2002 | Caillat et al. |
| 2002/0139123 | A1 | 10/2002 | Bell |
| 2002/0148236 | A1 | 10/2002 | Bell |
| 2003/0089391 | A1 | 5/2003 | Fukudome et al. |
| 2003/0099279 | A1 | 5/2003 | Venkatasubramanian et al. |
| 2003/0140957 | A1 | 7/2003 | Akiba |
| 2004/0075167 | A1 | 4/2004 | Nurnus et al. |
| 2004/0094192 | A1 * | 5/2004 | Luo ........................... 136/203 |
| 2004/0231714 | A1 * | 11/2004 | Stark et al. ................. 136/211 |
| 2004/0242169 | A1 | 12/2004 | Albsmeier et al. |

FOREIGN PATENT DOCUMENTS

| | | |
|---|---|---|
| DE | 6900274 | 8/1970 |
| DE | 2124465 | 11/1972 |
| DE | 2457586 | 6/1975 |
| DE | 297 23 309 | 3/1997 |
| DE | 29723309 U1 | 10/1998 |
| DE | 10231445 | 1/2004 |
| EP | 0034538 | 8/1981 |
| EP | 0408572 A1 | 8/1989 |
| EP | 0408572 A | 1/1991 |
| EP | 0408572 B1 | 2/1993 |
| GB | 1381001 | 1/1975 |
| JP | 43-25391 | 11/1968 |
| JP | 61259580 | 11/1986 |
| JP | 02198181 | 6/1990 |
| JP | 3-502859 | 6/1991 |
| JP | 7-7186 | 1/1995 |
| JP | 7-335943 | 12/1995 |
| JP | 09107129 | 4/1997 |
| JP | 09224387 | 8/1997 |
| JP | 10-51037 | 2/1998 |
| JP | 2003-92432 | 3/2003 |
| JP | 2003-133600 | 5/2003 |
| JP | 2003179275 | 6/2003 |
| JP | 2004104041 | 4/2004 |
| JP | 2004241657 | 8/2004 |
| JP | 2006086510 | 3/2006 |
| RU | 2113035 C1 | 8/1990 |
| WO | WO89/07836 | 8/1989 |
| WO | 99/54941 | 10/1999 |
| WO | 00/30185 | 5/2000 |
| WO | 02/23642 | 3/2002 |
| WO | 02/095707 | 11/2002 |
| WO | WO02/095707 | 11/2002 |
| WO | 03/007391 | 1/2003 |
| WO | 03/015186 | 2/2003 |
| WO | 2004/105143 | 12/2004 |
| WO | 2004/105146 | 12/2004 |
| WO | 2005/074463 | 8/2005 |
| WO | 2005/098970 | 10/2005 |
| WO | 2005/117154 | 12/2005 |
| WO | 2008/013584 | 1/2008 |

OTHER PUBLICATIONS

Stordeur, Matthias et al., "Low Power Thermoelectric Generator - self-sufficient energy supply for micro systems," 16$^{th}$ International Conference on Thermoelectrics, pp. 575-577 (1997).

Stark, Ingo et al., "New Micro Thermoelectric Devices Based on Bismuth Telluride-Type Thin Solid Films," 18$^{th}$ International Conference on Thermoelectronics, pp. 465-472 (1999).

Stölzer, M. et al., "Optimisation of p—$(Bi_{0.25}Sb_{0.75})_2Te_3$ and n—$Bi_2(Te_{0.9}Se_{0.1})_3$ Films for Thermoelectric Thin Film Components," 5 pages.

Bergstresser, T.R. et al., "Copper on Polyimide Flexible Substrate for Ultra-Thin, High Performance Applications," 4 pages.

Vining, Cronin B., "Semiconductors are cool," Nature, vol. 413, pp. 577-578 (Oct. 11, 2001).

Venkatasubramanian, Rama et al., "Thin-film thermoelectric devices with high room-temperature figures of merit," Nature, vol. 413, pp. 597-602 (Oct. 11 2001).

Chen, G., "Thermal conductivity and ballistic-phonon transport in the cross-plane direction of superlattices," Phys. Rev. B, vol. 57, No. 23, pp. 14958-14973 (Jun. 15, 1998).

Hicks, L.D. et al., "Effect of quantum-well structures on the thermoelectric figure of merit," Phys. Rev. B, vol. 47, No. 19, pp. 12727-12731 (May 15, 1993).

Kiely, J.H. et al., "Characteristics of $Bi_{0.5}Sb_{1.5}Te_3/Be_2Te_{2.4}Se_{0.6}$ thin-film thermoelectric devices for power generation," Meas. Sci. Technol., vol. 8, pp. 661-665 (Jun. 1997).

Nolas, G.S. et al., Thermoelectrics, "Basic Principles and New Materials Developments," Springer, Berline, pp. 111-146 (2001).

Tritt, T., "Recent Trends in Thermoelectric Materials Research III," Academic Press, London, vol. 7, pp. 50-55 (2001).

Schaevitz, Samuel B. et al., "A Combustion-Based MEMS Thermoelectric Power Generator," The 11$^{th}$ International Conference on Solid-State Sensors and Actuators, Munich, Germany, 4 pages (Jun. 10-14, 2001).

21$^{st}$ International Conference on Thermoelectrics, Jet Propulsion Laboratory, California Institute of Technology, Massachusetts Institute of Technology; "Texture formation in extruded rods of (Bi,SB)2(Te,Se)3 thermoelectric alloys," Vasilevskiy, E. et al. (Aug. 26-29, 2002).

Thin-film Superlattice Thermoelectric Technology, www.rti.org, 4 pages (2002).

Physics of Thin Films: Sputter Deposition (Ohring: Chapter 3, sections 5-6), www.uccs.edu/~tchriste/courses/PHYS549/549lectures/sputter.html., 4 pages (Printed Nov. 21, 2002).

Physics of Thin Films: Sputter Deposition Techniques (Ohring: Chapter 3, section 7), www.uccs.edu/~tchriste/courses/PHYS549/549lectures/sputtertech.html., 5 pages (Printed Nov. 21, 2002).

Venkatasubramanian, R., "Thin-film Superlattice Thermoelectric Devices for Power Conversion and Cooling," www.its.org/its/ict2002/Abstracts/Rama_Venkatasubramanian.htm (Printed Sep. 26, 2003).

D.T.S. GmbH: Thin Film Thermoelectric Generators, D.T.S., www.dts-generator.com/index.htm (Printed May 4, 2004).

D.T.S. GmbH: Thin Film Thermoelectric Generators, Low Power Thermoelectric Generators; www.dts-generator.com/gen.txe.htm (Printed May 4, 2004).

D.T.S. GmbH: Thin Film Thermoelectric Generators, Infrared-Sensors, www.dts-generator.com/sen-txe.htm (Printed May 4, 2004).

D.T.S. GmbH: Thin Film Thermoelectric Generators, Research and development, www.dts-generator.com/dev-txe.htm (Printed May 4, 2004).

Schmidt, F. et al., "Batterielose Funksensoren, betrieben mit Energie aus der Umgebung," 5 pages (Mar. 2002).

International Search Report and Written Opinion for PCT/US2004/040460, filed Dec. 2, 2004.

Bergstresser, T.R. et al., "Copper on Polyimide Flexible Substrate for Ultra-Thin, High Performance Applications," 4 pages (2000).

Final Office action from the U.S. Patent and Trademark Office for U.S. Appl. No. 10/726,744, dated Feb. 29, 2008.

International Search Report and Written Opinion for PCT/US2004/040460, filed Dec. 2, 2004 (mailed Mar. 7, 2006).
Stölzer, M. et al., "Optimisation of p—$(Bi_{0.25}Sb_{0.75})_2Te_3$ and n—$Bi_2(Te_{0.9}Se_{0.1})_3$ Films for Thermoelectric Thin Film Components," 2nd Symposium on Thermoelectrics-Materials, Processing Techniques & Applications, 5 pages (1994).
Office Action from the United States Patent & Trademark Office in U.S. Appl. No. 10/726,744, dated Jun. 27, 2007.
Abrikosov, N Kh, et al., "Phase transitions and electrophysical properties of the solid solutions based on GeTe at the cross-section of GeTe-$AgSbTe_2$," *Izvestiya Akademii Nauk SSSR, Neoorganicheskie Materialy*, Abstract Only, vol. 20, No. 1, pp. 55-59 (1984).
Androulakis et al., "Nanostructuring and its Influence on the Thermoelectric Properties of the $AgSbTe_2$-SnTe Quaternary System," *Materials Research Society Symposium Proceedings*, vol. 886, Abstract Only, 1 page (2006).
Decheva, S.K., "Studies on the Thermoelectric Characteristics of Cold-Pressed Materials of the Type of $(GeTe)x$—$(AgSbTe_2)(1-x)$," *Bulgarian Journal of Physics*, Abstract Only, vol. 6, No. 2, pp. 194-200 (1979).
DeSteese, J. G. et al., "Technology Development: Wireless Sensors and Controls BT0201," Excerpt from Statement of Work from PNNL to U.S. Department of Energy, Building Technologies Program, 31 pages (Sep. 2004).
DeSteese, J. G., "Thermoelectric Ambient Energy Harvester," a White Paper for the Defense Logistics Agency, pp. 1-4 (undated).
Martin, P. M. et al., "Si/SiGe Superlattices for Thermoelectric Applications" *Proceedings of the 46th Annual Technical Conference of the Society of Vacuum Coaters*, pp. 126-129 (2003).
Martin, P. M. et al., "Scale Up of Si/ $Si_{0.8}Ge_{0.2}$ and $B_4C/B_9C$ Superlattices for Harvesting of Waste Heat," *Proceedings of Deer*, 6 pages (2003).
Martin, P. M. et al., "Recent Advances in Scale Up of Si/SiGe Superlattices for Thermoelectric Applications," Abstract Only, presented at the Functional Coating and Surface Engineering Conference 2003, Montreal, Canada, 3 pages. (Jun. 4-7, 2003).
Martin, P. M. et al., "Nanostructured multilayer $B_4C/B_9C$ and $Si/Si_{0.8}Ge_{0.2}$ films for advanced detector and thermoelectric applications," *Proceedings of 2004 AIMCAL Conference*, 7 pages (2004).
Martin, P. M. et al., "Superlattice Coatings for Device, Structural and Protective Applications," *Proceedings of AIMCAL 2006 Fall Technical Conference*, invited, 10 pages (2006).
Martin, P. M. et al., "Recent advances in magnetron sputtered superlattice and quantum well structures," *Proceedings of SPIE*, vol. 6403, pp. 640310-10-to 640310-11 (2006).
Martin, P. M. et al., "Magnetron-Sputtered Nanolaminate and Superlattice Coatings," *Proceedings of SPIE*, vol. 6403, pp. 640310-1 to 640310-9 (2006).
Office action from the U.S. Patent and Trademark Office in U.S. Appl. No. 11/004,611, dated Jan. 7, 2008.
Plachkova, S.K. et al., "Materials for Thermoelectric Application Based on the System GeTe-$AgBiTe_2$," *Physica Status Solidi (A)*, Abstract Only, vol. 184, Issue 1, pp. 195-200 (Mar. 2001).
Plachkova, S.K., "Thermoelectric figure of merit of the system $(GeTe)_{1-x}(AgSbTe_2)_x$," *Phys. Stat. Sol (A)*, Abstract Only, vol. 83, No. 1, pp. 349-356 (1984).
Plachkova, S.K., "Thermoelectric Power in the System $(GeTe)_{1-x}(AgSbTe_2)_x$," *Phys. Status Solidi (A)*, Abstract Only, vol. 80, No. 1, pp. K97-K100 (Nov. 16, 1983).
Sharp, J. W., "Some Properties of GeTe-Based Thermoelectric Alloys," *IEEE 22nd International Conference on Thermoelectrics*, pp. 267-270 (2003).
Yamanaka, S. et al., "Thermoelectric properties of $T_{19}BiTe_3$," *Journal of Alloys and Compounds*, vol. 352, pp. 275-278 (2003).

Office action from the U.S. Patent and Trademark Office in U.S. Appl. No. 10/726,744, dated Aug. 4, 2008.
Final Office action from the U.S. Patent and Trademark Office in U.S. Appl. No. 11/004,611, dated Dec. 17, 2008.
Office Action from Chinese Patent Office for Chinese Patent Application No. 200480035827.0, dated Dec. 5, 2008.
Office Action from the European Patent Office for European Patent Application No. 04822138.6, dated Feb. 11, 2009.
Office Action from the Japanese Patent Office for Japanese Patent Application No. 2006- 542773, dated Feb. 23, 2009 (with translation).
Bottner, H., "Thermoelectric Micro Devices: Current State, Recent Developments and Future Aspects for Technological Progress and Applications," *Proc. 21st Int. Conf. Thermoelectronics*, Long Beach, CA, pp. 511-518 (Aug. 25-29, 2002).
Final Office action from the U.S. Patent and Trademark Office for U.S. Appl. No. 10/726,744, dated Apr. 13, 2009.
Kim, D.-H. et al., "Effect of deposition temperature on the structural and thermoelectric properties of bismuth telluride thin films grown by co-sputtering," *Thin Solid Films*, vol. 510, pp. 148-153 (2006).
Office action from the U.S. Patent and Trademark Office in U.S. Appl. No. 10/581,281, dated Apr. 30, 2009.
Sun, C.W. et al., "Crystallization behavior of non-stoichiometric Ge-Bi-Te ternary phase change materials for PRAM application," *J. Phys. Condens. Matter*, vol. 19, 446004, 9 pages (2007).
Allinson, A.J. et al., "Microstrucural Changes in a Monostable Chalcogenide Switch Glass," *Journal of Non-Crystalline Solids*, vol. 31, No. 1, pp. 307-331 (Apr. 1, 1979).
Cook, A. B. et al., "Nature of the cubic to rhombohedral structural transformation in $(AgSbTe_2)_{12}(GeTe)_{85}$ thermoelectric material," *Journal of Applied Physics*, vol. 101, No. 5, pp. 053715-1-053715-6 (Mar. 14, 2007).
International Search Report and Written Opinion for PCT/US2008/074345, filed Aug. 26, 2008 (mailed Sep. 16, 2009).
International Search Report and Written Opinion for PCT/US2008/077748, filed Sep. 25, 2008 (mailed Sep. 22, 2009).
Nurnus, J. et al., "Structural and Thermoelectric Properties of $Bi_2Te_3$ Based Layered Structures," *Proc. 19th Int. Conf. Thermoelectrics*, Cardiff, U.K., pp. 236-240 (Aug. 25-29, 2000).
Office action from the U.S. Patent and Trademark Office in U.S. Appl. No. 11/004,611, dated Aug. 3, 2009.
Office action from the U.S. Patent and Trademark Office in U.S. Appl. No. 10/726,744, dated Oct. 1, 2009.
Wagner, Andrew V. et al., "Sputter Deposition of Semiconductor Superlattices for the Thermoelectric Applications," *Mat. Res. Soc. Symp. Proc.*, vol. 450, pp. 467-472 (Dec. 2-5, 1996).
Final Office action from the U.S. Patent and Trademark Office in U.S. Appl. No. 10/581,281, dated Dec. 16, 2009.
Kim, et al., "Effects of a Reduction Treatment and Te Doping Properties of $(Bi_{1-x}Sb_x)_2Te_3$ Fabricated by Mechanical Alloying," 16th *International Conference on Thermoelectrics*, pp. 127-130 (1997).
Notification of Reasons for Refusal from the Japanese Patent Office for Japanese Patent Application No. 2006-542773, dated Jan. 20, 2010 (with translation).
Yamashita, O. et al., "Bismuth telluride compounds with high thermoelectric figures of merit," *Journal of Applied Physics*, vol. 93, No. 1, pp. 368-374 (Jan. 1, 2003).
Final Office action from the U.S. Patent and Trademark Office in U.S. Appl. No. 11/004,611, dated Mar. 4, 2010.
Office action from the U.S. Patent and Trademark Office in U.S. Appl. No. 10/726,744, dated Mar. 3, 2010.

* cited by examiner

TE Module With Discreet Elements

Thin-Film TE Array

THERMOELECTRIC POWER SOURCE UTILIZING AMBIENT ENERGY HARVESTING FOR REMOTE SENSING AND TRANSMITTING

STATEMENT REGARDING FEDERALLY SPONSORED RESEARCH OR DEVELOPMENT

This invention was made with Government support under Contract DE-AC0676RLO1830 awarded by the U.S. Department of Energy. The Government has certain rights in the invention.

BACKGROUND OF THE INVENTION

Advances in electronics have created a variety of devices having heretofore unanticipated capabilities and requirements. In many circumstances, these devices present capabilities and requirements that are particularly useful in remote or inaccessible locations where the electrical power necessary to operate the devices is not readily available. For example, remote sensors, such as might be used to measure temperature, pressure, humidity, the presence or movement of vehicles, humans and animals, or other environmental attributes, can easily be configured to acquire and transmit such data to a more accessible location. Several options are available for providing power to such devices, such as batteries and solar cells, however, each of these approaches has drawbacks.

While battery technology has advanced tremendously in recent years, any device that draws electrical energy resulting from a chemical reaction has a useful life limited by the duration of the chemical reaction. Thus, remote applications relying exclusively on batteries are inherently limited by the battery life and reliability. Environmental factors can hinder the useful life of solar energy sources used in remote locations as well. Excessive cloud cover and shifting weather patterns can make solar cells unreliable. Dust and debris deposited on the surface of solar devices by rain or other weather related effects together with normal aging can also degrade the regular operation of these devices. Due to the drawbacks associated with these and other power technologies, there remains a need for reliable power sources that can operate over long time periods in remote locations.

Different constraints apply in non-remote settings. For example, in large buildings, tens of thousands of sensors could be usefully employed to provide smart sensing and control of energy delivery and distribution, as well as sensing and reporting of environmental conditions. At present, this vision is impractical because conventional power solutions are either technically inadequate or too expensive. Fitting every sensor with a battery power supply involves the above noted performance limitations of batteries in addition to the high cost of initial installation and periodic replacement. The alternative of hard wiring a large number of sensors to a central supply would improve reliability, but would necessarily involve complex circuitry and cost that make this approach economically unviable. These deficiencies of conventional solutions are overcome by integral, long-lived power sources that produce electric power by harvesting and converting ambient energy in the manner provided by this invention.

One potential source of energy for such devices theoretically may be found in the differing temperatures that occur naturally in these remote, non-remote and less accessible locations, since it is known that thermoelectric devices can generate electric power in response to the existence of a temperature differential across the thermoelectric device. However, the distances across typical thermo electric devices are typically small, that heretofore none have been successfully configured to take advantage of the temperature variation between, for example, the ground below and the air above it.

BRIEF SUMMARY OF THE INVENTION

Accordingly, it is an object of the present invention to provide methods and apparatus for providing reliable power for long periods of time. These and other objects of the present invention are accomplished by taking advantage of temperature differences existing in the environment, and providing devices and techniques to convert these differences in temperature into electrical energy. The present invention in particular relies on the use of techniques and devices to harvest ambient energy in the environment, thereby focusing and concentrating temperature differences that exist in natural and man made environments. Thus, while the present invention is most advantageous in remote and less accessible locations, the concept and operation of the present invention is equally applicable in any environment having at least two regions of different temperature.

Accordingly, the present invention is a method and apparatus for providing electrical energy to an electrical device wherein the electrical energy is originally generated from temperature differences in an environment having a first and a second temperature region. The first and second temperature regions may, for example, be adjacent features of the natural environment that exhibit a pervasive difference of temperature, such as the ground and the air above the ground or the air inside and outside of heating, air-conditioning or ventilation ducts in buildings. While large temperature differences assist in the generation of electrical energy in a thermoelectric device, one of the several advantages of the present invention is that it allows for the generation of electrical energy in environments having very slight temperature differences. Accordingly, while not meant to be limiting, it is preferred that the temperature difference between said first temperature region and said second temperature region be between 0.5° F. and 100° F., and it is more preferred that the temperature differential between said first temperature region and said second temperature region be between 0.5° F. and 50° F. It should be noted that the present invention is useful beyond the preferred temperature ranges and at all intermediate temperature ranges. It should further be noted that the present invention is operable in applications wherein the relative temperatures of the first and second regions are reversed on occasion, as is the case, for example when soil is the first temperature region and air is the second temperature region, and the two are in a climate wherein the soil tends to be cooler than the air in the summer time, and hotter than the air in the winter time, or vise versa.

As shown in FIG. 1, the present invention in one embodiment is thus an apparatus for generating electrical energy from an environment having a first temperature region and a second temperature region comprising a thermoelectric device 1 having a first side and a second side wherein the first side is in communication with a means 2 for transmitting ambient thermal energy collected or rejected in the first temperature region and the second side is in communication with the second temperature region thereby producing a temperature gradient across the thermoelectric device and in turn generating an electrical current. Preferably, in addition to the first means 2 for transmitting ambient thermal energy on the first side of the apparatus, the apparatus further utilizes a second means 3 for transmitting ambient energy collected or rejected in said second temperature region and in communication with the second side of the thermoelectric device. While not meant to be limiting, an example of a means for transmitting ambient energy would include a heat pipe. However, as used herein, the terms "transmitting energy" and/or "transmitting ambient energy" should be understood to include, either alone or in combination, collecting ambient energy, focusing ambient energy, or transferring ambient energy, (wherein transferring ambient energy could be performed by convection, conduction, radiation, and combinations thereof), and the means for "transmitting energy" or "transmitting ambient energy" should be understood to included any of the wide variety of devices known to those having skill in the art that are capable of collecting ambient energy, focusing ambient energy, or transferring ambient energy, either alone or in combination, and wherein transferring ambient energy is performed by convection, conduction, radiation, and combinations thereof. As examples of these heat delivery options, heat can be delivered or rejected at the thermally active surfaces of the TE element by natural convection in air or any other fluid existing on either side of a barrier, such as ductwork, in which the invention is mounted. Heat can be delivered to or removed from the TE device by the conduction and convection that occurs in a heat pipe. In this case, conduction occurs in the walls of the pipe and convection occurs in the interior working fluid contained in the heat pipe. The invention may be operated outdoors, where the primary heat input is photon radiation from the sun, and has also been demonstrated to operate in the laboratory, where the hot shoe was heated by radiation from a lamp. As is also used herein, "ambient" energy means energy available in or transmitted by media forming the environment surrounding the device and used by the present invention to generate electricity.

Whatever particular means or combination of means are selected for transmitting ambient energy, the goal remains the same; to gather enough of the energy in the surrounding environment to generate a useful amount of power in the thermoelectric device. Conceptually, a preferred embodiment of the present invention can be envisioned as a thermoelectric device that is placed at the boundary between two regions in the environment that exhibit pervasive differences in temperature. Means for transmitting the ambient energy in either of these regions to opposite sides or ends of the thermoelectric device extend into each of the respective energy regions, thereby amplifying the actual temperature difference experienced by the thermoelectric device, and exaggerating the boundary between the two energy regions.

Suitable thermoelectric devices may be constructed from: 1) metallic wire thermocouples including, but not limited to iron-constantan; copper-constantan; chromel-alumel; chromel-constantan; platinum-rhodium alloys and tungsten-rhenium alloys, 2) discrete element semiconductors assembled in alternating p- and n-type arrays connected electrically in series, parallel or series/parallel. All combinations that can be prepared as p-type semiconductors are suitable. Examples of such p-type materials that may be employed include, but are not limited to, bismuth telluride, lead telluride, tin telluride; zinc antimonide; cerium-iron antimonide; silicon-germanium. All combinations that can be prepared as n-type semiconductors are also suitable. Examples of such n-type materials that may be employed include, but are not limited to, bismuth telluride, lead telluride, cobalt antimonide; silicon-germanium. The thermoelements can further be formed of sputter deposited thin films of $Bi_xTe_y$, $Sb_xTe_y$, and $Bi_xSe_y$ alloys where x is typically about 2 and y is typically about 3.

While not meant to be limiting, preferred thermoelectric devices are composed of thin film semiconductors such as bismuth telluride sputter deposited as thin films on a substrate, as described in U.S. patent application Ser. No. 10/726,744 entitled "THERMOELECTRIC DEVICES AND APPLICATIONS FOR THE SAME" the entire contents of which are hereby incorporated herein by this reference. Other suitable thin-film devices include superlattice and quantum well structures. As shown in FIG. 1, the present invention is advantageously used to provide power to sensors 4, such as but not limited to those used for remote region monitoring and surveillance, measurement of ambient conditions such as environmental temperature, pressure, humidity and intrusion in remote areas and measurement and control of building environments and energy. The present invention may further be combined with a battery, capacitor, supercapacitor and any suitable device 5 that stores energy electrically for alternately storing and discharging electrical energy produced by the thermoelectric device. The combination of the present invention with any other combination of one or more sensors 4, transmitters 6, voltage amplifiers 7, microprocessors 8, data storage means 9, batteries or electrical storage devices 5 and voltage regulators 10 wherein the sensor(s) 4, batteries or storage devices 5, voltage amplifiers 7, microprocessors 8, data storage means 9, voltage regulators 10 and transmitters 6 are all ultimately powered by the electrical energy from the thermoelectric device 2, represents a preferred embodiment of the present invention. Once set in place, such a device is capable of gathering and transmitting data gathered by the sensor to a remote location for an essentially indefinite period of time and potentially for the lifetime of the application with no further human intervention required. The operation and advantages of the present invention are illustrated in the detailed description of a preferred embodiment that follows. However, this preferred embodiment is merely provided for such illustrative purposes, and the present invention should in no way be limited to the specific configuration described therein.

DETAILED DESCRIPTION OF THE INVENTION

Figure 1:
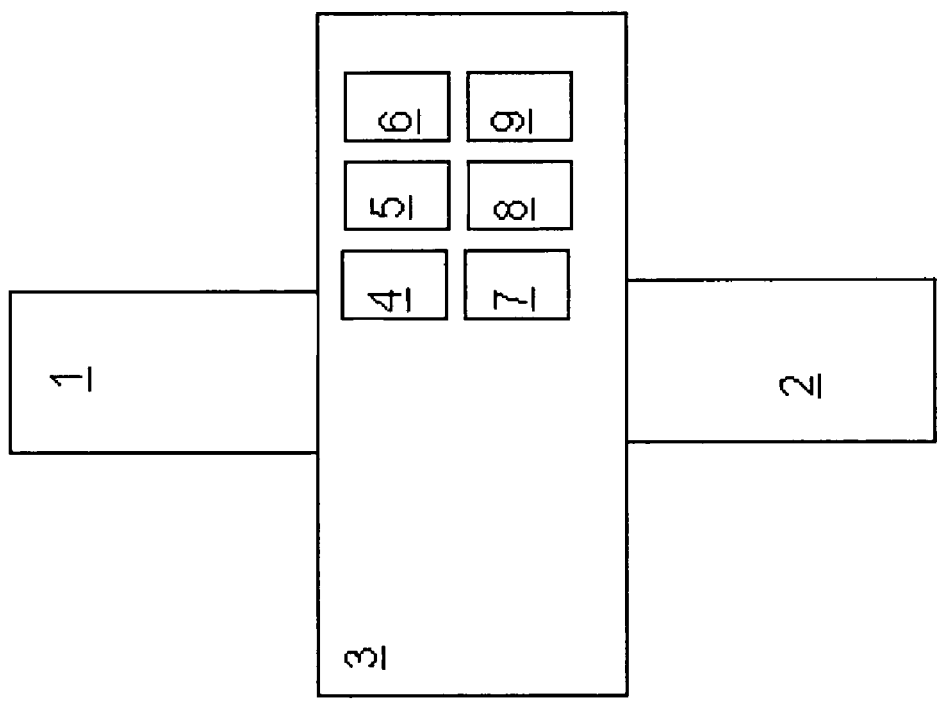
FIG. 1 is a schematic drawing of a preferred embodiment of the present invention.
Figure 2:
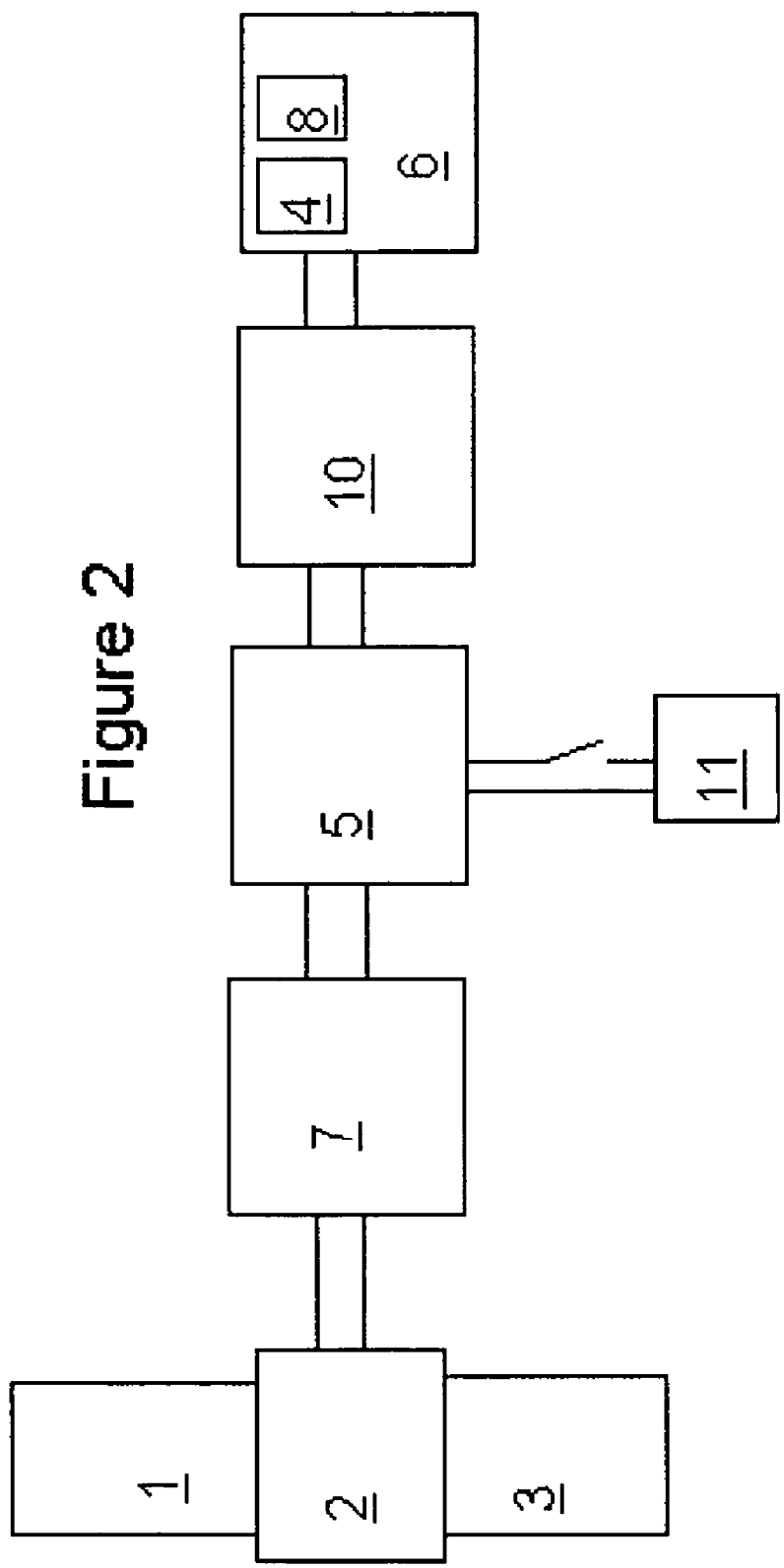
FIG. 2 is a block diagram of the components and circuit connections used to demonstrate the functionality and reduction of practice of this invention.
Figure 3:
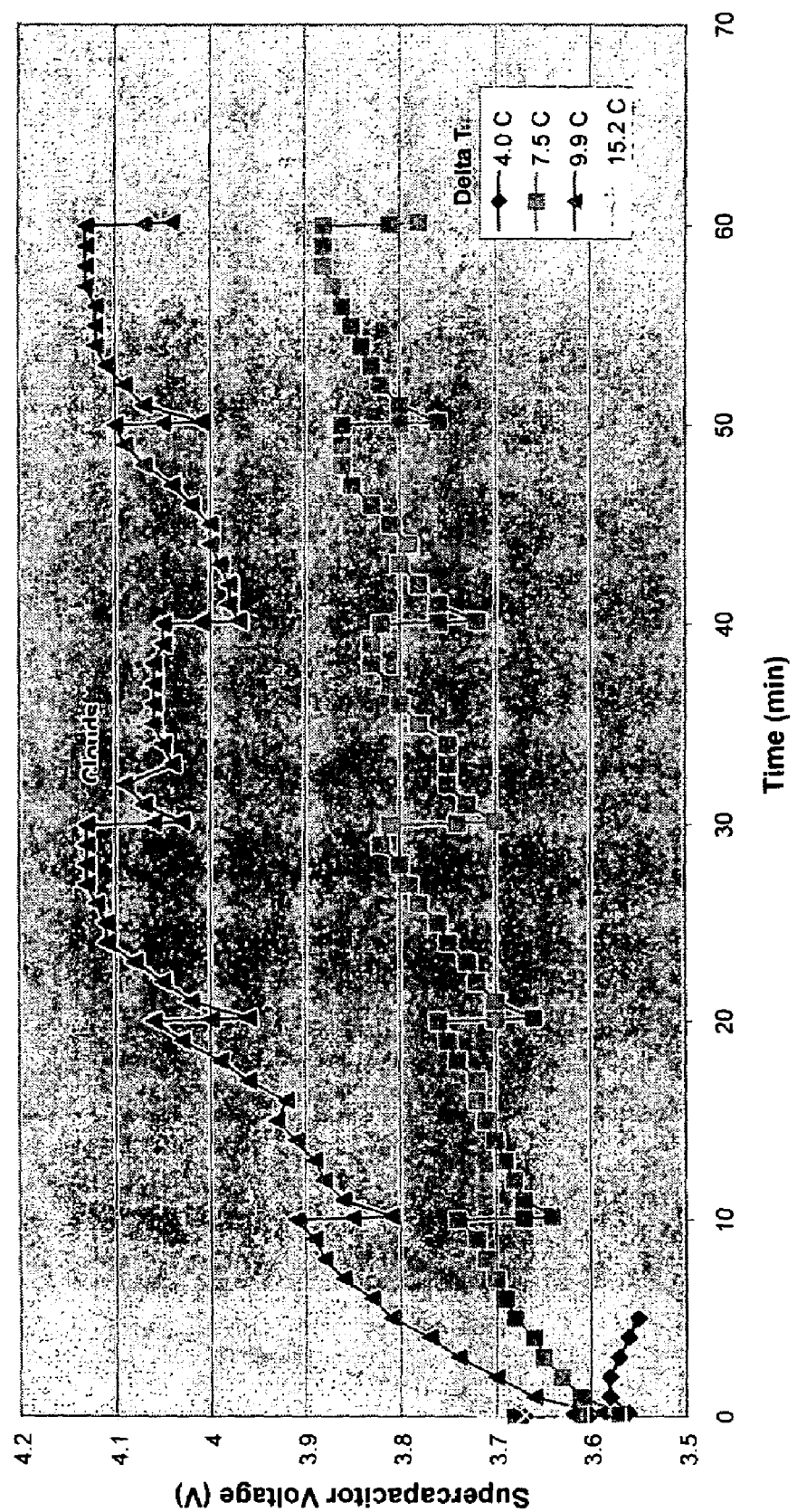
FIG. 3 is a graph showing the electrical charging and discharging of the device used in experiments that reduced a preferred embodiment of the present invention to practice.

A series of experiments were conducted to demonstrate the operation of a preferred embodiment of the present invention. The basic circuit configuration in these experiments is shown in FIG. 2. In this circuit, a commercial 40 mm×40 mm bismuth telluride thermoelectric element 2 supplied by MEL-COR of Trenton, N.J. was attached to heat pipes 1, 3 supplied by Beckwith Electronics of Fenton, Mo. One of the heat pipes supplied thermal energy from the warmer ambient region to the 40 mm×40 mm hot shoe side of the device. The second heat pipe 3 conducted heat from the corresponding 40 mm×40 mm cold shoe located on the opposite side of the thermoelectric element and dissipated this heat in the colder ambient region. The balance of the circuit consisted of a voltage amplifier 7, a supercapacitor 5, a temperature sensor 4, a microprocessor 8 that managed data acquisition and storage, a voltage regulator 10 and a radio frequency transmitter 6. The voltage amplifier 7 transformed the typically few tenths of a volt raw output of the thermoelectric device into as much as a 4.3 V for input into the supercapacitor 5. The balance of the system consisting of the temperature sensor 4, microprocessor 8, and transmitter 6 subsystem functioned properly when a charge of more than 3.6 V was maintained on the supercapacitor 5. This system transmitted temperature data periodically when operated in the laboratory with an electrical heat source and ambient cooling. The assembly was also operated outdoors in a natural environment. The cold side heat pipe 3 was buried in soil to provide the heat sink. The exposed hot side heat pipe 1 received ambient heat from the air above ground and also sunshine. Operating characteristics of this configuration are shown in FIG. 3. The figure shows that natural ambient energy successfully activated the thermoelectric element that was able to maintain a satisfactory charge on the supercapacitor when the temperature differential across the thermoelement was above 5° C. (9° F.). In this experiment, transmitter function was simulated by discharging from the supercapacitor, every 10 minutes, the same amount of energy the sensor/microprocessor/transmitter subsystem would have demanded when transmitting sensor data at 10 minute-intervals. This simulation of a transmission sequence was achieved by periodically closing the switch attached to the 10-kΩ resistive load 11 shown in FIG. 2. The vertical steps in the charging characteristics in FIG. 3 show the voltage drop that results from each simulated transmission sequence. The demonstrated ability of the thermoelectric element to recharge the supercapacitor after each simulated data transmission step is evidence that the invention functions usefully when powered solely by thermal energy in the natural ambient environment of the device.

Figure 4:
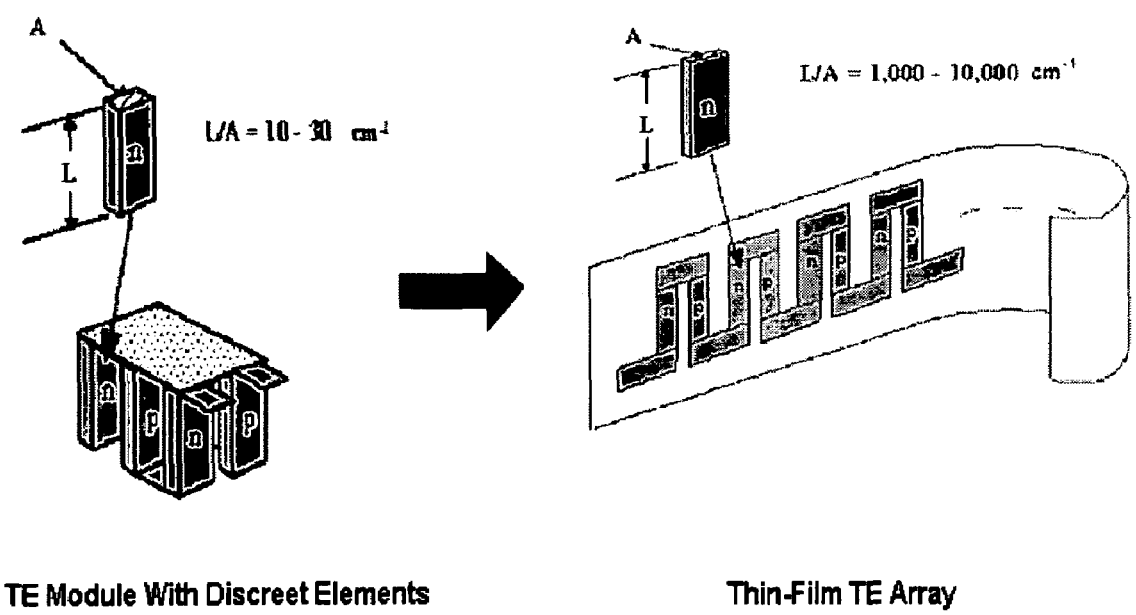
FIG. 4 is a schematic drawing showing the contrast between the configuration of conventional discrete element thermoelectric elements and a thermoelectric element composed of a plethora of miniature thin-film thermocouples with high length to cross-section ratios supported by a substrate that would be used in a preferred embodiment of the present invention.
Figure 5:
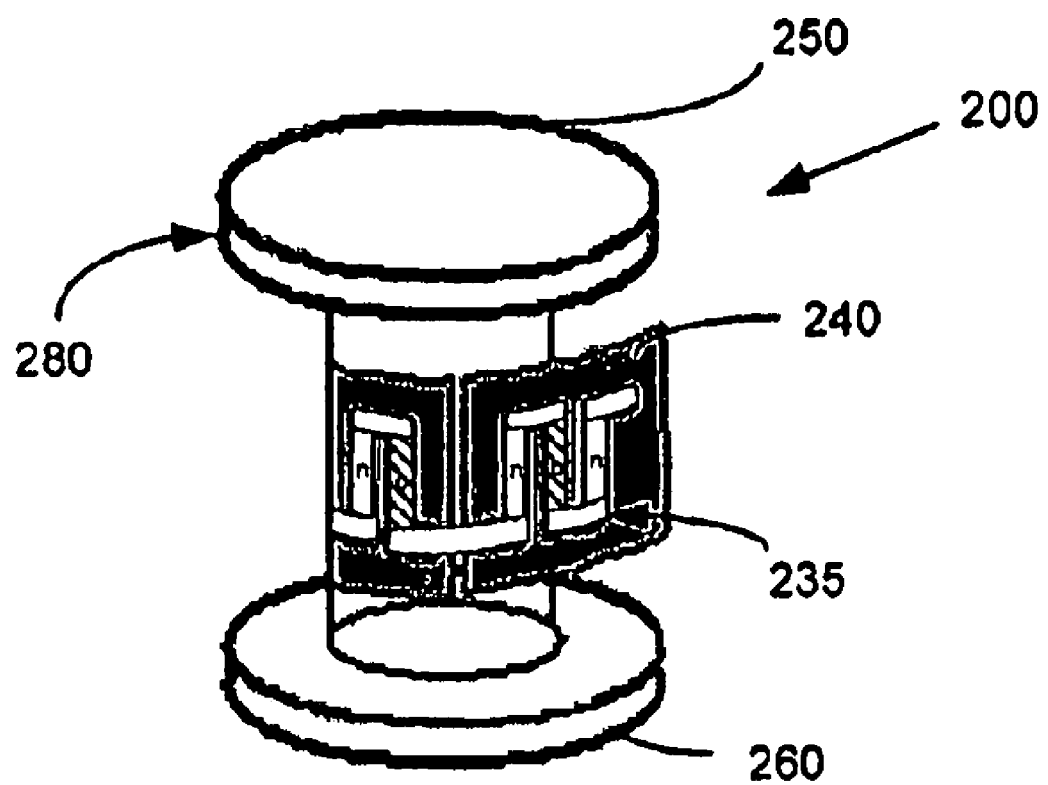
FIG. 5 illustrates an embodiment the disclosed TE power source in which TE thin film modules are wound about a spindle.

Commercial discrete element thermoelectric elements assembled in the conventional configuration shown in the left hand side illustration of FIG. 4 while useful in demonstrating the principles in this invention, typically have low-voltage outputs resulting from relatively low length to cross sectional area (L/A) ratios that require a separate voltage amplifier, as described above. The preferred solution is to use thermoelectric element composed of a plethora of miniature thin-film thermocouples with high length to cross-section ratios supported by a substrate shown in the right hand side illustration in FIG. 4 and described in greater detail in the companion U.S. patent application Ser. No. 10/726,744 entitled "THERMOELECTRIC DEVICES AND APPLICATIONS FOR THE SAME." More specifically, the disclosed TE power sources comprise, in part, arrays of TE couples having multiple thermoelements (e.g. an n-type and a p-type thermoelement pair). The thermoelements form the modules (thermocouples) for converting thermal energy to electrical energy. Such thermoelements typically comprise thin films of TE materials having L/A ratios greater than about 500 $cm^{-1}$. The devices include modules where thin films of p-type and n-type TE materials are deposited, e.g., on a suitable flexible substrate and are electrically connected to one another in series or in series-parallel. In one particular embodiment the TE power source 200 comprises multiple TE couples forming an array of modules 235 deposited onto a flexible substrate 240 (FIG. 5). The array of couples 235 is wound in a coil like fashion and positioned between hot and cold junctions 250 and 260. The array module 235 may simply form a coil or may be wound about an apparatus such as a spindle 280. Such a configuration provides an even smaller TE power source without sacrificing power output. Thermocouple assemblies of the latter type may be designed with output voltages higher than those typical of the discrete element type and are inherently more compact. The advances embodied in the preferred thin-film thermocouple concept enable this invention to be more efficient and compact and to be functional in simpler and cheaper assemblies.

Figure 6:
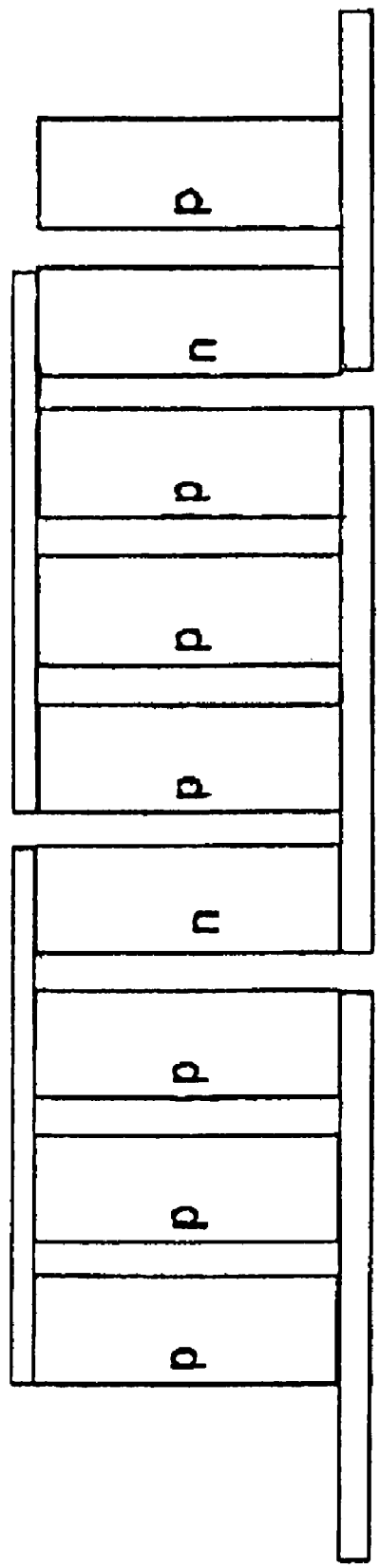
FIG. 6 shows an embodiment of the disclosed n-type and p-type TE thin films deposited on a flexible substrate wherein the n-type and p-type TE thin films are connected in a series-parallel arrangement.

FIG. 6 illustrates one embodiment of the thermoelectric power source comprising multiple p-type thermoelements in parallel with each other and connected in series with a single n-type thermoelement. As shown in FIG. 6, an embodiment of the disclosed n-type and p-type TE thin films deposited on a flexible substrate wherein the n-type and p-type TE thin films are connected in a series-parallel arrangement. In certain embodiments, two or more p-type thermoelements are positioned and electrically connected in parallel with one another and in series to n-type thermoelements. In other embodiments, two or more n-type thermoelements are positioned and electrically connected in parallel with one another and in series to p-type thermoelements. In other embodiments, multiple thermocouples are electrically connected to one another in series or in series-parallel. In such embodiments, the p-type thermoelements of the thermocouples may have different widths as compared to the n-type thermoelements.

A key parameter affecting the voltage produced by TE modules (also referred to herein as couples or thermocouples) is the length-to-area (L/A) ratio of the individual thermoelements, where A is the cross sectional area of a thermoelement. Current monolithic (or discrete element) modules are characterized by L/A values of less than about 20 cm-1. Certain embodiments of the disclosed thin film thermoelements have relatively large L/A ratio values, greater than about 20 $cm^{-1}$ and perhaps more typically greater than about 100 $cm^{-1}$. Certain embodiments of the disclosed thin film thermoelements have even larger L/A ratio values, for example up to about 1,000 to about 10,000 $cm^{-1}$ or greater. The thermoelements may comprise thin films of TE materials having L/A ratios greater than about 500 cm-1. The L/A ratio values of certain embodiments of the disclosed thermoelectric generators allow fabrication of μW to W power supplies providing voltages greater than 1 volt even when activated by relatively small temperature differences, such as 20° C. or 10° C., and certain embodiments even at temperature differences as small as about 5° C. The voltage required of the TE power source determines the number of thermocouples (TE modules) necessary and the desirable current determines the necessary L/A ratio of the thermoelements.

Closure

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

The invention claimed is:

1. A method for providing power comprising:
   providing a thermoelectric generator having a first end and a second end;
   exposing the first end of the thermoelectric generator to thermal energy of a first temperature region;
   exposing the second end of the thermoelectric generator to thermal energy of a second temperature region; and
   utilizing a difference between the thermal energy of the first temperature region and the thermal energy of the second temperature region to produce electric power from the thermoelectric generator regardless of whether the first temperature region is warmer or cooler than the second temperature region;
   wherein the thermoelectric generator comprises a plurality of thermocouples comprising p-type and n-type thin film semiconductor thermoelements formed on a single flexible substrate;
   wherein each thermocouple comprises at least three thermoelements; and
   wherein each of the p-type thermoelements and the n-type thermoelements has a length to area ratio of between from about 1,000 $cm^{-1}$ and to about 10,000 $cm^{-1}$.

2. A method for providing power comprising:
   providing a thermoelectric generator having a first end and a second end;
   exposing the first end of the thermoelectric generator to thermal energy of a first temperature region;
   exposing the second end of the thermoelectric generator to thermal energy of a second temperature region; and
   utilizing a difference between the thermal energy of the first temperature region and the thermal energy of the second temperature region to produce electric power from the thermoelectric generator regardless of whether the first temperature region is warmer or cooler than the second temperature region;
   wherein the thermoelectric generator comprises a plurality of thermocouples comprising p-type and n-type thin film semiconductor thermoelements formed on a single flexible substrate, the p-type or the n-type thermoelements having L/A ratios from about 500 $cm^{-1}$ to about 10,000 $cm^{-1}$;
   wherein a single p-type thermoelement is, or a plurality of p-type thermoelements in parallel with each other are, electrically connected in series with a single n-type thermoelement or with a plurality of n-type thermoelements in parallel with each other; and
   wherein each thermocouple comprises at least three thermoelements.

3. The method of claim 2 wherein said p-type thermoelements comprise antimony telluride, bismuth telluride, lead telluride, tin telluride, zinc antimonide, cerium-iron antimonide, silicon-germanium, or combinations thereof.

4. The method of claim 2 wherein said n-type thermoelements comprise antimony telluride, bismuth telluride, lead telluride, cobalt antimonide; silicon-germanium, or combinations thereof.

5. The method of claim 2 wherein the p-type thermoelements comprise antimony telluride, bismuth telluride, lead telluride, tin telluride, zinc antimonide, cerium-iron antimonide, silicon-germanium, or combinations thereof sputter deposited as thin films on a substrate; and the n-type thermoelements comprise antimony telluride, bismuth telluride, lead telluride, cobalt antimonide, silicon-germanium or combinations thereof sputter deposited as thin films on a substrate.

6. The method of claim 2 wherein the single, continuous flexible substrate is wound in a coil configuration.

7. The method of claim 2 wherein the single, continuous flexible substrate is wrapped around a spindle.

8. The method of claim 2 wherein each of the p-type thermoelements and the n-type thermoelements has a length to area ratio of between from about 1,000 $cm^{-1}$ and to about 10,000 $cm^{-1}$.

9. The method of claim 2 wherein the first temperature region comprises the ground and the second temperature region comprises air above the ground.

10. The method of claim 9 wherein exposing the first end of the thermoelectric generator to a first temperature region comprises attaching a first heat pipe to the first end of the thermoelectric generator and burying the first heat pipe at least partially in the ground.

11. The method of claim 10 wherein exposing the second end of a thermoelectric generator to the thermal energy of the second temperature region comprises attaching a second heat pipe to the second end of the thermoelectric generator wherein the first heat pipe and the second heat pipe have substantially equal heat conduction capacity.

12. The method of claim 2 wherein the first temperature region comprises air inside a building duct and the second temperature region comprises air outside the duct.

13. A method for providing power comprising:
    providing a thermoelectric generator having a first end and a second end;
    exposing the first end of the thermoelectric generator to thermal energy of a first temperature region;
    exposing the second end of the thermoelectric generator to thermal energy of a second temperature region; and
    utilizing a difference between the thermal energy of the first temperature region and the thermal energy of the second temperature region to produce electric power from the thermoelectric generator regardless of whether the first temperature region is warmer or cooler than the second temperature region;
    wherein the thermoelectric generator comprises a plurality of thermocouples comprising p-type and n-type thin film semiconductor thermoelements each sputter deposited on a single, continuous flexible substrate formed in a coil configuration, and wherein the p-type and n-type thermoelements have L/A ratios of from about 500 $cm^{-1}$ to about 10,000 $cm^{-1}$;
    wherein a single n-type thermoelement is, or a plurality of n-type thermoelements in parallel with each other are, electrically connected in series with a single p-type thermoelement or with a plurality of p-type thermoelements in parallel with each other; and
    wherein each thermocouple comprises at least three thermoelements.

* * * * *